(12) United States Patent
van Zeijl et al.

(10) Patent No.: US 6,525,621 B2
(45) Date of Patent: Feb. 25, 2003

(54) EQUALIZER CIRCUITS FOR USE IN RADIO FREQUENCY SIGNAL RECEIVERS

(75) Inventors: Paulus van Zeijl, Hengelo (NL); Henrik Geis, Lund (SE)

(73) Assignee: Telefon Aktiebolaget LM Ericsson (Publ) (SE)

( * ) Notice: Subject to any disclaimer, the term of this patent is extended or adjusted under 35 U.S.C. 154(b) by 0 days.

(21) Appl. No.: 09/740,922

(22) Filed: Dec. 19, 2000

(65) Prior Publication Data

US 2001/0008385 A1 Jul. 19, 2001

(30) Foreign Application Priority Data

Dec. 23, 1999 (GB) .............................. 9930527

(51) Int. Cl.[7] .................................. H04B 3/04
(52) U.S. Cl. .................................. 333/28 R; 381/103
(58) Field of Search ................ 333/28 R, 18, 333/172; 381/103; 327/286; 330/304

(56) References Cited

U.S. PATENT DOCUMENTS

| 3,506,856 A | * | 4/1970 | Toffler et al. ................. 333/18 |
| 3,733,565 A | * | 5/1973 | Pierret ......................... 333/28 |
| 4,413,240 A | | 11/1983 | Dyke ......................... 333/17 R |
| 5,245,565 A | | 9/1993 | Peterson et al. ............. 364/825 |
| 5,257,286 A | | 10/1993 | Ray ............................. 375/12 |
| 5,517,523 A | * | 5/1996 | Nabors et al. .............. 375/228 |
| 5,559,470 A | | 9/1996 | Laber et al. ................. 330/252 |
| 5,701,099 A | | 12/1997 | Shafir ........................ 327/552 |
| 5,805,031 A | | 9/1998 | Cheng ...................... 333/28 R |

FOREIGN PATENT DOCUMENTS

| EP | 0413934 A2 | 2/1991 |
| EP | 0549030 A1 | 6/1993 |
| EP | 1065850 A2 | 1/2001 |
| FR | 2128152 | 10/1972 |
| GB | 1386668 | 3/1975 |
| GB | 2005943 A | 4/1979 |
| GB | 2306068 | 4/1997 |
| WO | WO 8401866 | 5/1984 |
| WO | WO 9810527 | 3/1998 |

OTHER PUBLICATIONS

Search Report as performed on Jun. 1, 2000 by UK Patent Office, Examiner A J Oldershaw as pertaining to Patent Application GB 9930527.8.
Search Report as performed on Dec. 7, 2000 by UK Patent Office, Examiner A J Oldershaw as pertaining to Patent Application GB 9930527.8.
International Search Report as conducted by PCT on Apr. 26, 2001 as pertaining to PCT/EP/00/12677.
Huss, Scott D. et al. "An Integrated Two–Parameter Adaptive Cable Equalizer Using Continuous–Time Filters." 1997 IEEE International Symposium on Circuits and Systems '97. pp. 969–972.
Pai, Patrick K.D. et al. "A 40–m W 55 Mb/s CMOS Equalizer for Use in Magnetic Storage Read Channels." IEICE Transactions on Electronics; May, No. 5 '94. pp. 819–829.
Nauta, Bram, "A CMOS Transconductance–C Filter Technique for Very High Frequencies." IEEE Journal of Solid State Circuits, vol. 27, No. 2 92. pp. 142–153.

* cited by examiner

*Primary Examiner*—Robert Pascal
*Assistant Examiner*—Joseph Chang
(74) *Attorney, Agent, or Firm*—Jenkens & Gilchrist, A Professional Corporation

(57) ABSTRACT

An equalizer circuit comprises at least one tuneable transconductance element (12, 14, 16, 18, 22) having its operating parameters determined by its supply voltage (Vdd). An automatic tuning means can be used to vary the supply voltage of the or each transconductance element.

13 Claims, 4 Drawing Sheets

EQUALIZER CIRCUITS FOR USE IN RADIO FREQUENCY SIGNAL RECEIVERS

FIELD OF THE INVENTION

The present invention relates to equaliser circuits, and in particular to equaliser circuits for use in radio frequency (RF) signal receivers.

DESCRIPTION OF THE RELATED ART

Integrated receivers require intermediate frequency filters for selectivity: attenuation of strong (adjacent channel) signals at carriers close to the carrier of the desired signal. A post-detection filter usually helps also in attenuating the first adjacent channel signal. There is a compromise between adjacent channel performance, sensitivity, and co-channel performance. The higher the required selectivity, the worse the co-channel performance and sensitivity.

Equalisers are well-known in transmission systems. Equalisers are usually implemented in digital technology. This solution is not very useful, since the demodulation, and bit-slicing (the decision whether a bit is a "0" or a "1") is done in the analog domain. Shifting all this to the digital domain would increase the power consumption and increase the complexity.

It is therefore desirable to provide a simple equaliser that improves the sensitivity, co-channel performance and selectivity of a receiver.

It is also desirable in such circuits to be able to correct (or "tune") for changes in temperature and component tolerance.

SUMMARY OF THE PRESENT INVENTION

According to one aspect of the present invention, there is provided an equaliser circuit in which a resistance value and/or capacitance value can be tuned such that the overall performance is independent of component variation due to, for example, process spread and/or temperature variation.

According to another aspect of the present invention, there is provided an equaliser circuit which realizes the transfer function:

$$H(s) = R\left(\frac{k}{1+sRC} - 1\right)$$

in which R is a resistance value, C is a capacitance value and k is the gain of an amplifier.

According to another aspect of the present invention, there is provided an equalizer circuit comprising transconductance elements, at least one of which is a tuneable element having operating parameters determined by a tuning voltage of the element.

According to another aspect of the present invention, there is provided an equaliser circuit realizing the transfer function:

$$H(s) = \frac{R_2}{1+SR_2C}k - R_1$$

in which $R_1$, $R_2$ are respective resistance values, C is a capacitance value, and k is the gain of an amplifier.

DESCRIPTION OF THE PREFERRED EMBODIMENTS

As is well known, equalisers are used to reduce distortion and delays, etc. in received signals. For example equalisers can be used to overcome problems concerning phase shift and pulse distortion.

Figure 1:
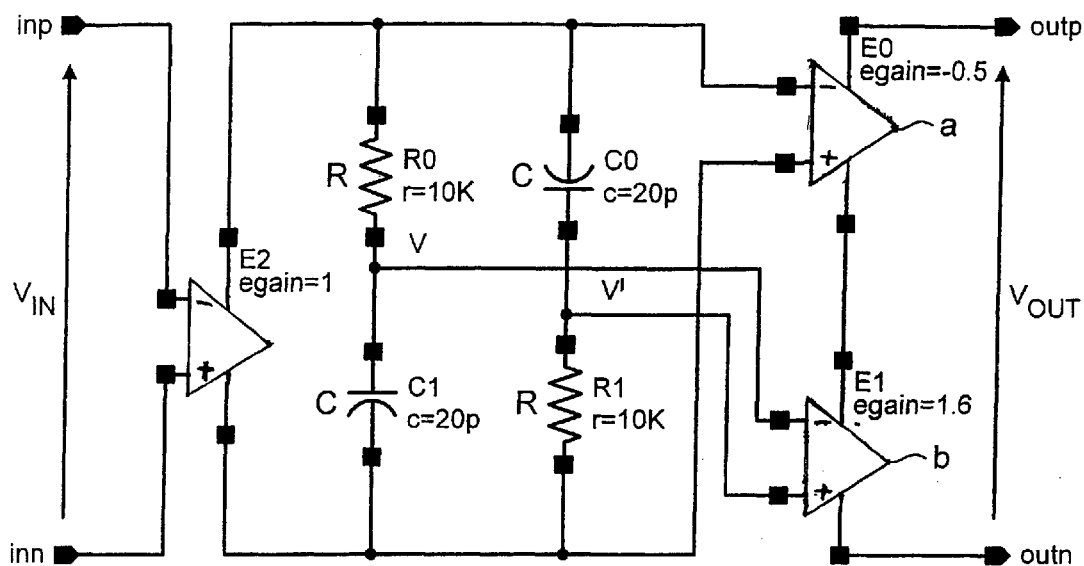
FIG. 1 is a circuit diagram of an equaliser embodying one aspect of the present invention.

FIG. 1 illustrates an equaliser circuit embodying the invention, which circuit is based on voltage-domain techniques. The FIG. 1 circuit comprises two R-C networks which are connected to provide respective signals V, V'. In this example, it is assumed that the resistance values are equal and that the capacitance values are equal. However, these components can have different values to one another. The input signal is amplified by a factor a, and the difference between the signals V and V' is amplified by a factor b. The output signal $V_{out}$ of the circuit is provided by the difference between these two amplified signals. The transfer function H(f) of the FIG. 1 circuit can be written as:

$$H(f) = a + b\frac{1-j\omega RC}{1+j\omega RC} = (a+b)\frac{1-j\omega RC\left(\frac{b-a}{b+a}\right)}{1+j\omega RC}$$

with a pole $f_p$ and a zero $f_n$ at $$f_p = \frac{-1}{2\pi RC}$$

$$f_n = \frac{1}{2\pi RC}\frac{b+a}{b-a} = (-f_p)\frac{b+a}{b-a}$$

Note that the zero is at a lower frequency than the pole and that it is in the Right-Half-Plane (b>a). The low-frequency gain $H_l$ and the high-frequency gain $H_h$ can be written as:

$$H_l = a+b, H_h = b-a$$

The frequencies $f_n$ and $f_p$ should usually be chosen quite close to half the bit-rate of the system. The constants a and b should be chosen such that the sensitivity, selectivity and co-channel performance is optimised. For example, suitable values are: a=−0.6, b=1.6, with R=10 kΩ and C=20 pF.

In the current domain, the above-described transfer function can be written as:

$$H(s) = a + b \cdot \frac{(1-sRC)}{(1+sRC)}$$

in which a and b are gain constants, R is a resistance value and C is a capacitance value.

Figure 2:
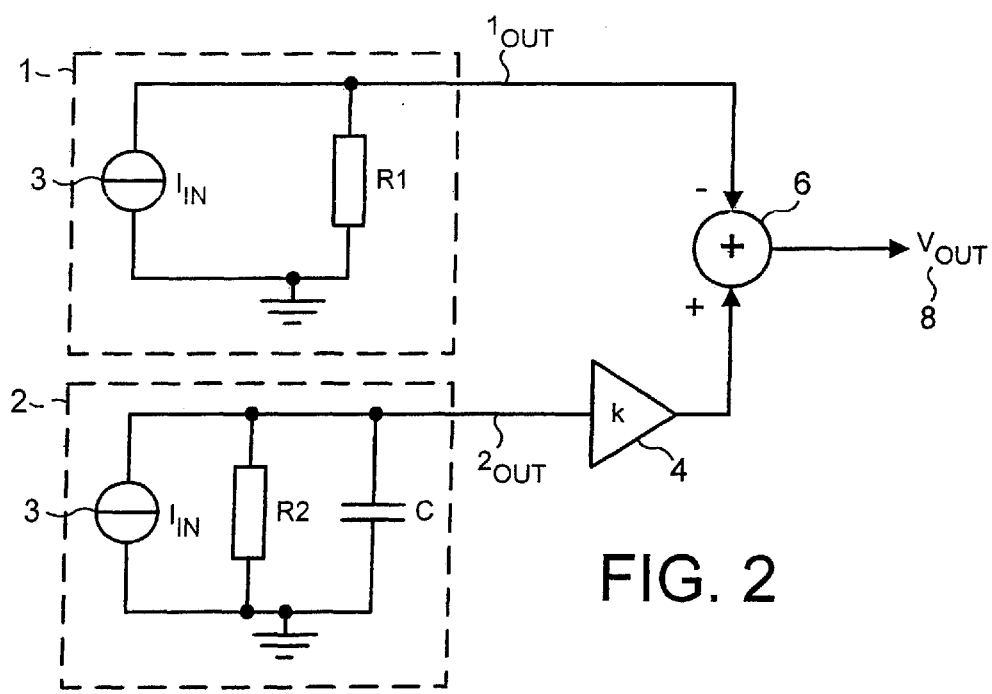
FIG. 2 is a circuit diagram of an equaliser another aspect of the present invention.

FIG. 2 illustrates an equaliser circuit embodying the present invention, which circuit is based on current-domain techniques. The equaliser illustrated in FIG. 2 includes two circuit branches 1 and 2. The first branch of the circuit includes a resistor R1 connected between the input and ground. The input signal is represented by a current source 3 connected between the input and ground (i.e. in parallel with R1). The second branch 2 of the circuit comprises a resistor R2 and a capacitor C, connected in parallel with one other between the input and ground. The output 2 out of the first branch 1 of the current is amplified by an amplifier 4 of gain K.

The output 1 out of the first branch is combined with the amplified output from the second branch 2 by a summing circuit 6. The output 8 ($V_{OUT}$) of the summing circuit equals the amplified output signal from branch 2 minus the output signal $1_{OUT}$ from branch 1.

The transfer function for the circuit of FIG. 2 can be shown to be (with R1=R2=R):

$$H(s) = \frac{Vout}{Iin} = R\left\{\frac{k}{1+sRC} - 1\right\} = R(k-1)\frac{1-\frac{sRC}{k-1}}{1+sRC} \quad (1)$$

The pole and zero of this circuit can then be identified as:

$$fp = -\frac{1}{2\pi RC} \quad (2)$$

$$fz = \frac{k-1}{2\pi RC} \quad (3)$$

In one particular example, the pole and zero can be shown such that fp=800 kHz and fz=360 kHz. For the FIG. 1 circuit, R1=R2=20 kΩ and C=9.9472 pF to get fp=800 kHz. Fz=360 kHz gives a k=1.45. This means that the DC-transresistance gain will be 0.45R, so the whole transfer function must be scaled 1/0.45 times to get R as the DC-transresistance gain. It is to be noted that R1 need not equal R2, since other combinations and values of these components may be used to determine different pole and zero values.

When $R_1$ does not equal $R_2$, the transfer function can be written as:

$$H(s) = \frac{R_2}{1+SR_2C}k - R_1$$

in which $R_1$, $R_2$ are respective resistance values, C is a capacitance value, and k is the gain of an amplifier.

Figure 3:
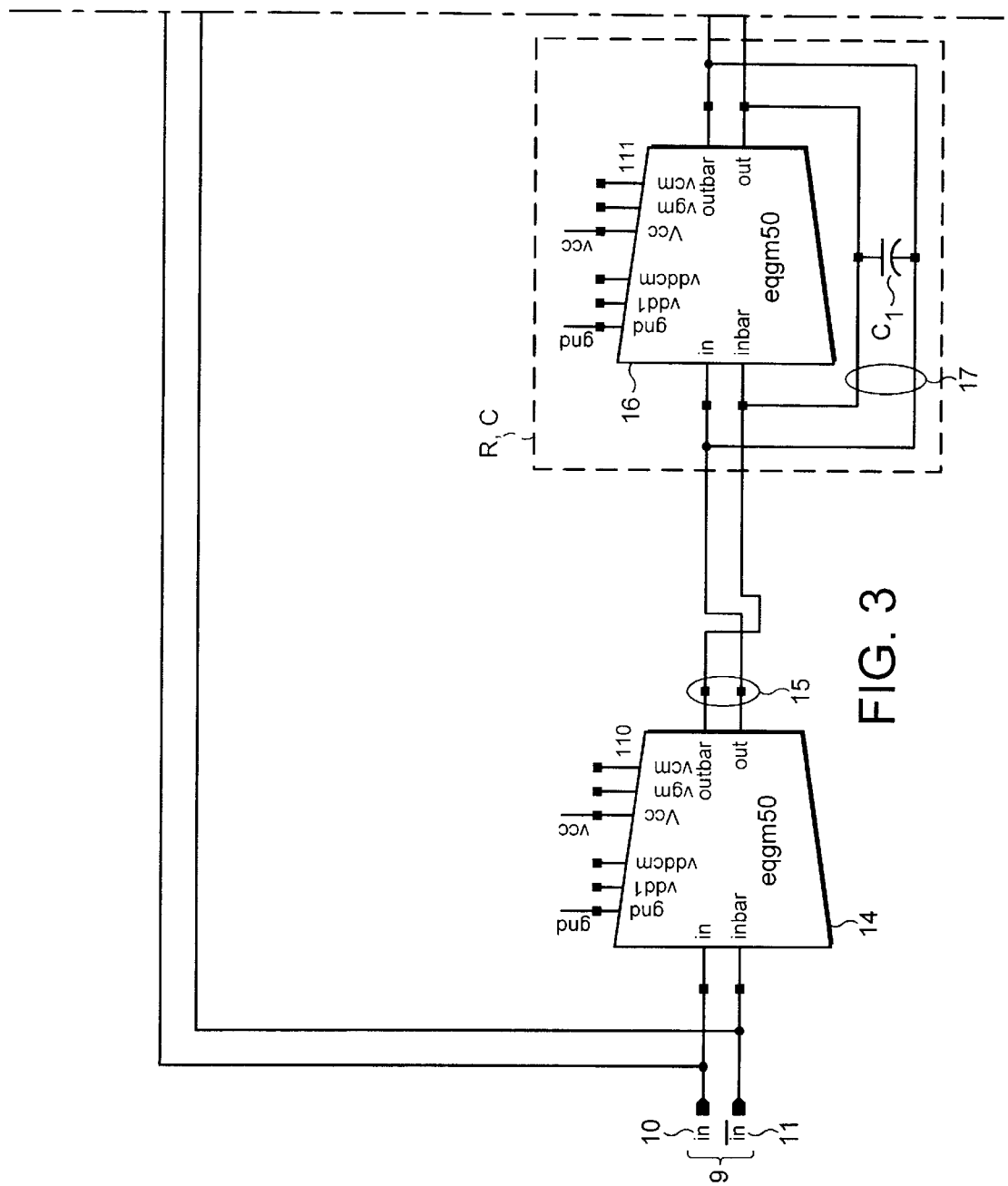
FIG. 3 is a block diagram of an equaliser embodying another aspect of the present invention.
Figure 3:
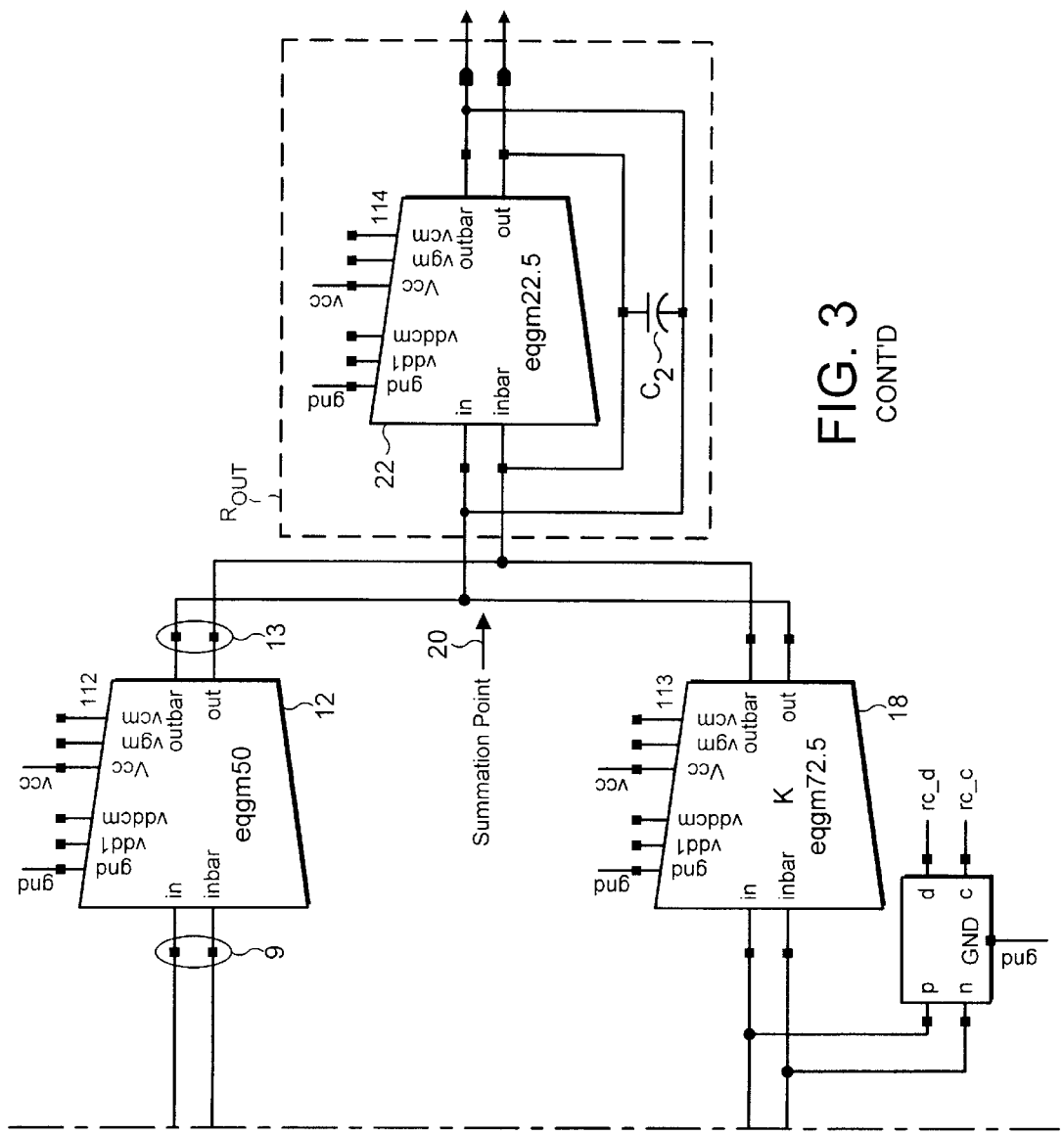

FIG. 3 illustrates an equaliser embodying another aspect of the present invention which receives an input voltage signal 9 comprising the signal 10 and its complement 11. The input signal is supplied to first and second branches of the circuit. The first branch comprises a transconductance element 12 which receives the input signal 9 and supplies an output signal 13. The element 12 operates to convert the voltage input to a current signal.

The input signal 9 is also supplied to the second branch of the circuit which includes a transconductance element 14 which converts the voltage input to a current signal 15. This current signal 15 is supplied to a transconductance element 16 connected to provide a resistor R by the use of a negative feedback loop 17. The loop 17 connects the output (out) to the complement of the input (inbar) and the complement of the output (outbar) to the input (in) of the element. A capacitor C is connected in parallel across the lines of the negative feedback loop 17. The amplifier of gain K of FIG. 1 is supplied by a further transconductance element 18. The two branches of the circuit are summed at a summation point 20, for supply to an output resistance 22.

The input signal 9 is referred to voltage and hence converted to respective current signals using a transconductance element connected to the input nodes for each branch of the circuit. These are transconductances with gm=50 μA/V (single ended value). The resistor in the first (upper) branch of FIG. 1 can be omitted because the signal needs to be converted to current for the summation anyway. The R-C network of the second branch provided by the transconductance element 16 effectively converts the current signal back to a voltage signal, which allows the use of a voltage to current transconductance element 18 to provide the amplifier of gain K of FIG. 1. The scaling factor k can be made using different gm values of the voltage-to-current converting transconductance elements before the summation. For example, using NMOS devices, $g_m$ is given by:

$$g_m = \sqrt{K_P \times (W/L) \times I_d},$$

where $K_p = \mu \cdot Cox$ ($\mu$=mobility, Cox=gate capacitance per unit area), W=width of the device, L=length of the device, Id=drain current through the device.

Scaling W/L or using several devices in parallel, a scaled $g_m$ value can be realised.

The currents from them are then summed (note the minus sign is done by cross coupling the outputs from the upper branch) and fed to a final transconductance element 22. The element 22 is connected to provide a resistance.

At the output node another capacitor is connected across the feedback loop of the element 22 to investigate the sensitivity to parasitic capacitances at that node. The node provides fairly high-impedance using the current values for the elements and hence a voltage buffer (not shown) is needed to isolate the output node. One can also make an extra pole above the intended pole, $f_p$ using this capacitor. If this is the case, the transconductance values of the three rightmost elements (12, 18 and 22) of FIG. 3, can be increased proportionally to make the capacitance less sensitive to local mismatch.

The pole frequency could be expected to be 1–3 MHz in an actual implementation and could be treated as adding one more pole to any filtering which may be required anyway, for example a post-detection filter. Hence, it would be harmless. Furthermore, the pole can be made up of larger parasitic components and by that way controlled accurately by the auto-tuner.

Figure 4:
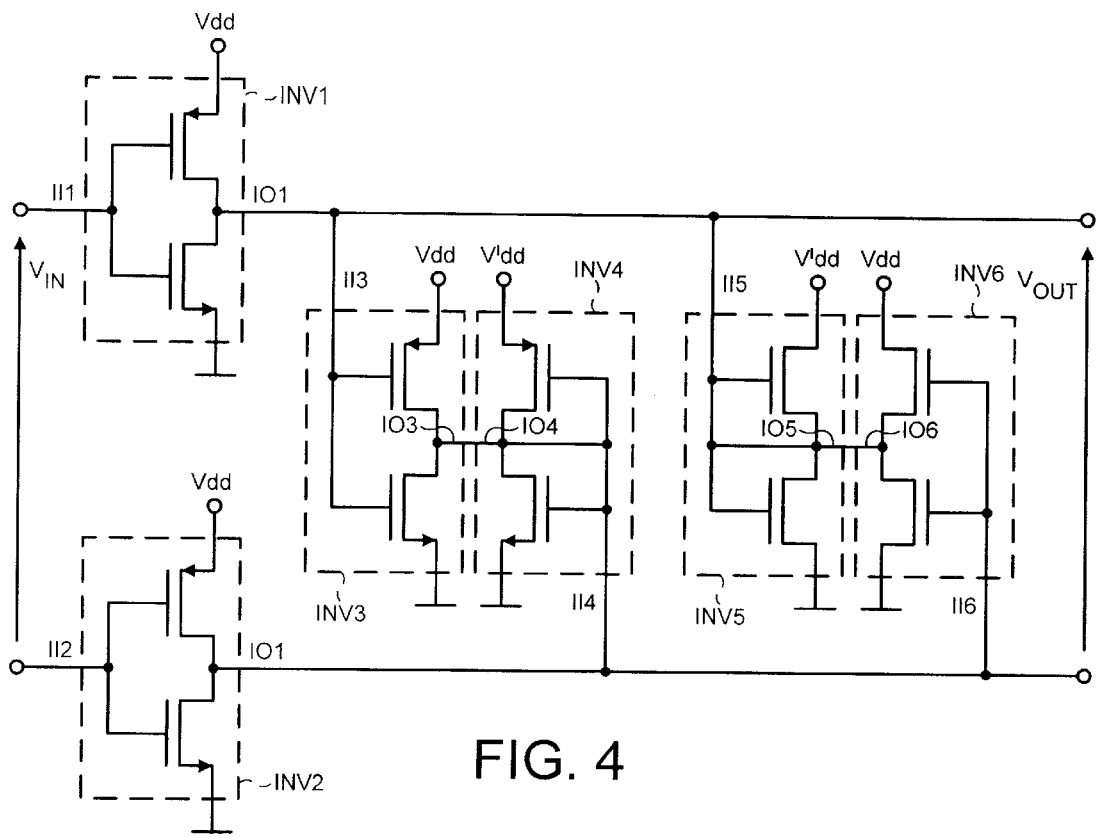
FIG. 4 illustrates a transconductance element.

The transconductance elements are preferably those described in "A CMOS transconductance-C filter technique for very high frequencies" by Bramm Nauta published in the IEEE Journal of Solid State Circuits volume 27 no. 2 February 1992. One such transconductance element is illustrated in FIG. 4, and comprises six CMOS inverters INV 1 to INV 6. The circuit is supplied with an input voltage V IN between two input terminals II 1 and II 2. The input II 1 is the input to a first inverter INV 1 which supplies an inverted output IO 1. The second input II 2 is the input to a second inverter INV 2 which supplies an inverted output IO 2. A third inverter INV 3 has its input II 3 connected to the output of the first inverter INV 1, and a fourth inverter INV 4 has its input II 4 connected to the output IO 2 of the second inverter INV 2. The outputs IO 3 and IO 4 of the third and fourth inverters INV 3 and INV 4 are connected to one another and to the input II 4 of the fourth inverter INV 4. The input of fifth inverter INV 5 is connected to the output of the first inverter, and the input of a sixth inverter INV 6 is connected to the output of the second inverter INV 2. The outputs IO 5 and IO 6 of the fifth and sixth inverters INV 5 and INV 6 are connected together and to the input II 5 of the fifth inverter INV 5.

The output of the transconductance circuit V OUT is supplied between the outputs IO 1 and IO 2 of the first and second inverters INV 1 and INV 2.

As will be appreciated from FIG. 4, the first, second, third and sixth inverters are supplied with a first supply voltage VDD and the fourth and fifth inverters are supplied with a second supply voltage VDD dashed. In the simplest case, VDD equals VDD dashed, but these two values can be varied.

Figure 5:
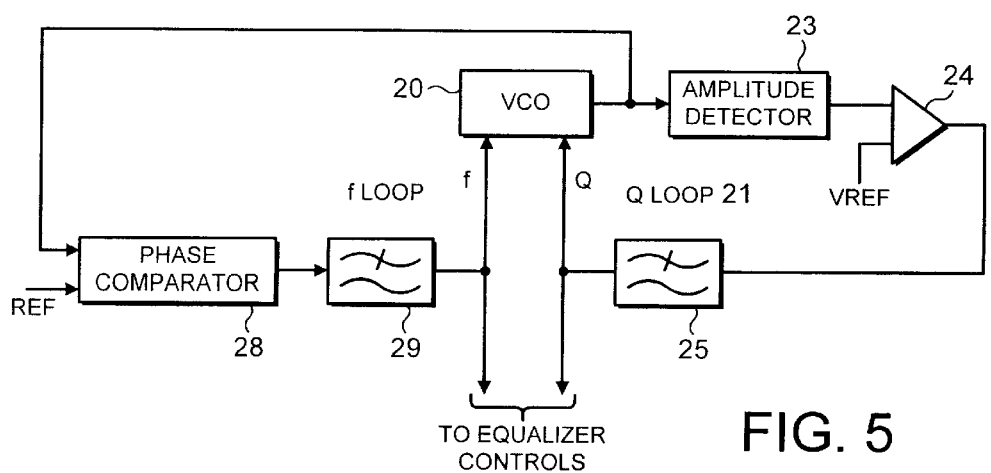
FIG. 5 shows auto-tuning circuitry suitable for tuning the equaliser of FIG. 3.

One feature of such transconductance elements is the fact that they can be tuned using a tuning circuit described in the document mentioned. FIG. 5 shows a circuit diagram of such a tuning circuit. The use of transconductance elements for realisation of an equalizer enables tuning of the equalizer by variance of the supply voltages (Vdd and V¹dd) of the transconductances.

To correct the frequency response of an integrated filter for process and temperature variations, tuning of the cut-off frequency (f-tuning) is generally applied. Several filters are also provided with automatic tuning of the quality factors (Q-tuning). Combined f- and Q-tuning can be applied with either a master voltage-controlled filter (VCF) or a master voltage-controlled oscillator (VCO).

FIG. 5 illustrates the method using a master VCO (voltage controlled oscillator) 20. The VCO 20 has a controllable frequency F and quality factor Q. The quality factor is controlled by a Q-tuning loop 21. If the Q of the VCO 20 is infinite, then the VCO 20 will oscillate harmonically with a constant amplitude (the poles are exactly on the jw axis of the complex plane). The Q-loop 21 is used to control the amplitude of the VCO 20 in such a way that it will oscillate with a constant amplitude. The Q-loop 21 comprises an amplitude detector 23, a comparator 24 and a low pass filter 25. The comparator 24 compares the output of the amplitude detector 23 with a reference voltage. The output of the comparator is then filtered by the LPF 25 to produce the Q control voltage. Using the voltage provided for tuning the Q of the two integrators in the master VCO, the equalizer Q can be tuned appropriately. The amplitude of the VCO signal is uncritical as long as the integrators in the VCO operate in their linear region.

The frequency f is controlled by an f-control loop which is a well-known phase-locked loop (PLL) which locks the oscillating frequency to an external reference frequency. The f-loop uses a phase comparator 28 to compare the phase of the VCO output with that of a reference signal. The comparator output is passed through a low pass filter 29 to produce the f-control voltage. The voltage used for tuning the frequency of the VCO is supplied to the transconductances used in the equalizer to tune the equalizer.

The combination of f- and Q-tuning is possible if the f- and Q-control loops are independent. If the Q-tuning loop is much faster than the f-tuning loop, the f-tuning loop will be quasi-static and then the f- and Q-loops become practically independent.

If the Q of the VCO is infinite, it will oscillate harmonically at a frequency determined by $V_{dd}$, (frequency tuning) and $V'_{dd}$ (Q tuning).

For every value of $V_{dd}$ for frequency tuning there is only one value of $V'_{dd}$ which results in a correct Q-value. The inverse is also true: for each $V_{dd}$ there is only one value of $V_{dd}$ so that the Q is correct. It follows that the frequency can as well be tuned with $V_{dd}$ if the Q loop controls $V'_{dd}$. $V_{dd}$ and $V'_{dd}$ will then be related correctly.

What is claimed is:

1. An equalizer circuit, said equalizer circuit comprising a plurality of circuit elements including an amplifier of gain k, and circuit elements that provide a resistance value R and a capacitance value C, said equalizer circuit realizing the transfer function:

$$H(s) = R\left(\frac{k}{1+sRC} - 1\right).$$

2. An equalizer circuit as claimed in claim 1, wherein the resistance value R, and the amplifier of gain k, are provided by transconductance elements.

3. An equalizer circuit, said equalizer circuit comprising a plurality of circuit elements including an amplifier of gain k, and circuit elements that provide resistance values $R_1$ and $R_2$ and a capacitance value C, said equalizer circuit realizing the transfer function:

$$H(s) = \frac{R_2}{1+SR_2C}k - R_1.$$

4. An equalizer circuit as claimed in claim 3, wherein the resistance values $R_1$, $R_2$ and the amplifier of gain k, are provided by transconductance elements.

5. An equalizer circuit as claimed in claim 2 or 4, comprising:
   an input for receiving an input signal;
   a first transconductance element connected to receive an input signal from the input and operable to produce a first element signal;
   a second transconductance element connected to receive an input signal from the input and operable to produce a second element signal;
   a third transconductance element connected to receive the second element signal and operable to produce a third element signal; the third element having an input and an output and a feedback loop connected therebetween, such that the third element has the characteristics of a resistance element;
   a capacitive element connected with the feedback loop of the third trandconductance element;
   a fourth transconductance element connected to receive the third element signal and operable to produce a fourth element signal; and
   a fifth transconductauce element connected to receive the first and fourth element signals and operable to produce an output signal dependent upon the difference between the first and fourth element signals,
   each of the first, second, third, fourth and fifth transconductance elements having respective operating characteristics determined by respective tuning voltages.

6. An equalizer circuit as claimed in claim 2 or 4 wherein at least one of the transconductance elements comprises a plurality of inverters having respective inputs and outputs, the inverters being arranged such that:
   the input voltage signal to the element is received between the inputs of first and second inverters;
   the output of the first inverter is connected to the inputs of third and fifth inverters and provides one output terminal of the element;
   the output of the second inverter is connected to the inputs of fourth and sixth inverters and provides a second output terminal of the element:
   the outputs of the third and fourth inverters are connected to one another and to the input of the fourth inverter;
   the outputs of the fifth and sixth inverters are connected to one another and to the input of the fifth inverter; and
   the first, second, third and sixth inverters have a first supply voltage, and the fourth and fifth inverters have a second supply voltage.

7. An equalizer circuit as claimed in claim 5, comprising an automatic tuning means which is operable to vary the tuning voltages of the first, second, third, fourth and fifth transconductance elements with reference to a reference signal.

8. An equalizer circuit as claimed in claim 7, wherein the automatic tuning means comprises a voltage controlled oscillator which is operable to produce an output signal, and is connected to receive control signals which determine the characteristics of the output signal, means for comparing the output signal of the voltage controlled oscillator with a reference amplitude signal so as to produce a first control signal, and means for comparing the output signal of the voltage controlled oscillator with a reference phase signal so as to produce a second control signal, the first and second control signals being supplied to the voltage controlled oscillator of the tuning means, and serving to control the tuning voltages of the first, second, third, fourth and fifth transconductance elements of the equalizer circuit, thereby controlling the operating characteristics of the transconductance elements.

9. An equalizer circuit as claimed in claim 7, wherein the tuning voltage comprise supply voltages of a concerned transconductance element.

10. An equalizer circuit, said equalizer circuit including a plurality of circuit elements including circuit elements that provide a resistance value R, a capacitance value C, and gain constants a and b, said equalizer circuit realizing the transfer function:

$$H(s) = a + b \cdot \frac{(1 - sRC)}{(1 + sRC)}.$$

11. An equalizer circuit as claimed in claim 10, wherein the gain constants a and b, the resistance value R and the capacitance value C are tuned.

12. An equalizer circuit as claimed in claim 10 or 11, wherein a tuning voltage used for tuning an IF filter of a receiver is used to tune the equalizer.

13. An equalizer apparatus comprising a series of equalizer circuits as claimed in any one of claims 1, 3 or 10.

* * * * *

UNITED STATES PATENT AND TRADEMARK OFFICE
CERTIFICATE OF CORRECTION

PATENT NO. : 6,525,621 B1
DATED : February 25, 2003
INVENTOR(S) : Paulus T. Van Zeijl It is certified that error appears in the above-identified patent and that said Letters Patent is hereby corrected as shown below:

Title page,
Item [73], delete "Telefon Aktiebolaget" and replace with -- Telefonakiebolaget --

Column 1,
Lines 6, 7, 26, 36, 41, 50 and 66, delete "equaliser" and replace with -- equalizer --
Lines 19 and 20, delete "equalisers" and replace with -- equalizers --

Column 2,
Lines 1, 3, 7, 61 and 63, delete "equaliser" and replace with -- equalizer --
Lines 11 and 12, delete "equalisers" and replace with -- equalizers --
Line 15, delete "equaliser" and replace with -- equalizer --

Column 3,
Line 44, delete "equaliser" and replace with -- equalizer --

Column 6,
Line 41, delete "transconductauce" and replace with -- transconductance --.

Signed and Sealed this

Fifteenth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,525,621 B2
DATED : February 25, 2003
INVENTOR(S) : Paulus T. Van Zeijl It is certified that error appears in the above-identified patent and that said Letters Patent is hereby corrected as shown below:

<u>Title page,</u>
Item [73], Assignee, delete "Telefon Aktiebolaget" and replace with
-- Telefonaktiebolaget --

Signed and Sealed this

Seventeenth Day of August, 2004

JON W. DUDAS
*Acting Director of the United States Patent and Trademark Office*